(12) United States Patent
Momma et al.

(10) Patent No.: US 10,541,372 B2
(45) Date of Patent: Jan. 21, 2020

(54) LIGHT-EMITTING DEVICE AND MANUFACTURING METHOD THEREOF

(71) Applicant: Semiconductor Energy Laboratory Co., Ltd., Atsugi-shi, Kanagawa-ken (JP)

(72) Inventors: Yohei Momma, Isehara (JP); Tomohiko Suganoya, Kawachi (JP); Saki Obana, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/055,612

(22) Filed: Aug. 6, 2018

(65) Prior Publication Data

US 2018/0358566 A1    Dec. 13, 2018

Related U.S. Application Data

(60) Continuation of application No. 15/583,058, filed on May 1, 2017, now Pat. No. 10,043,989, which is a
(Continued)

(30) Foreign Application Priority Data

Dec. 23, 2011    (JP) .................... 2011-282481

(51) Int. Cl.
*H01L 33/00*    (2010.01)
*H01L 51/00*    (2006.01)
(Continued)

(52) U.S. Cl.
CPC ...... *H01L 51/0097* (2013.01); *H01L 27/1225* (2013.01); *H01L 27/3258* (2013.01);
(Continued)

(58) Field of Classification Search
CPC .............. H01L 29/785; H01L 29/7849; H01L 29/99795; H01L 51/0097
(Continued)

(56) References Cited

U.S. PATENT DOCUMENTS

| | | |
|---|---|---|
| 5,650,363 A | 7/1997 | Endroes et al. |
| 6,573,652 B1 | 6/2003 | Graff et al. |

(Continued)

FOREIGN PATENT DOCUMENTS

| | | |
|---|---|---|
| CN | 001714309 A | 12/2005 |
| CN | 101290445 A | 10/2008 |

(Continued)

OTHER PUBLICATIONS

Chinese Office Action (Application No. 201210559293.8) dated Jul. 18, 2016.
(Continued)

*Primary Examiner* — David S Blum
(74) *Attorney, Agent, or Firm* — Robinson Intellectual Property Law Office; Eric J. Robinson

(57) ABSTRACT

A light-emitting device having a curved light-emitting surface is provided. Further, a highly-reliable light-emitting device is provided. A substrate with plasticity is used. A light-emitting element is formed over the substrate in a flat state. The substrate provided with the light-emitting element is curved and put on a surface of a support having a curved surface. Then, a protective layer for protecting the light-emitting element is formed in the same state. Thus, a light-emitting device having a curved light-emitting surface, such as a lighting device or a display device can be manufactured.

11 Claims, 9 Drawing Sheets

Related U.S. Application Data continuation of application No. 15/236,710, filed on Aug. 15, 2016, now Pat. No. 9,680,115, which is a continuation of application No. 14/492,607, filed on Sep. 22, 2014, now Pat. No. 9,443,918, which is a division of application No. 13/716,934, filed on Dec. 17, 2012, now Pat. No. 8,859,304.

(51) Int. Cl.
| | |
|---|---|
| H01L 51/56 | (2006.01) |
| H01L 33/52 | (2010.01) |
| H01L 27/12 | (2006.01) |
| H01L 27/32 | (2006.01) |
| H01L 51/52 | (2006.01) |

(52) U.S. Cl.
CPC .......... *H01L 33/52* (2013.01); *H01L 51/5203* (2013.01); *H01L 51/524* (2013.01); *H01L 51/5237* (2013.01); *H01L 51/5246* (2013.01); *H01L 51/5253* (2013.01); *H01L 51/56* (2013.01); *H01L 27/32* (2013.01); *H01L 27/3244* (2013.01); *H01L 2251/301* (2013.01); *H01L 2251/5338* (2013.01); *H01L 2924/0002* (2013.01); *Y02E 10/549* (2013.01); *Y02P 70/521* (2015.11)

(58) Field of Classification Search
USPC .......................................... 257/190, 93, 100
See application file for complete search history.

(56) References Cited

U.S. PATENT DOCUMENTS

| | | |
|---|---|---|
| 6,953,735 B2 | 10/2005 | Yamazaki et al. |
| 6,956,324 B2 | 10/2005 | Yamazaki |
| 7,060,591 B2 | 6/2006 | Yamazaki et al. |
| 7,067,392 B2 | 6/2006 | Yamazaki et al. |
| 7,166,006 B2 | 1/2007 | Cok |
| 7,180,091 B2 | 2/2007 | Yamazaki et al. |
| 7,335,573 B2 | 2/2008 | Takayama et al. |
| 7,368,307 B2 | 5/2008 | Cok |
| 7,442,957 B2 | 10/2008 | Yamazaki et al. |
| 7,446,339 B2 | 11/2008 | Yamazaki et al. |
| 7,495,256 B2 | 2/2009 | Yamazaki et al. |
| 7,692,199 B2 | 4/2010 | Arai |
| 7,777,409 B2 | 8/2010 | Yamazaki et al. |
| 7,854,640 B2 | 12/2010 | Yamazaki |
| 7,858,411 B2 | 12/2010 | Yamazaki et al. |
| 8,013,335 B2 | 9/2011 | Yamazaki et al. |
| 8,134,153 B2 | 3/2012 | Yamazaki et al. |
| 8,143,629 B2 | 3/2012 | Arai |
| 8,269,225 B2 | 9/2012 | Arai |
| 8,525,171 B2 | 9/2013 | Yamazaki et al. |
| 8,614,450 B2 | 12/2013 | Kim |
| 8,648,381 B2 | 2/2014 | Tachibana et al. |
| 8,657,456 B2 | 2/2014 | Yamagata et al. |
| 8,735,899 B2 | 5/2014 | Yamazaki et al. |
| 8,766,269 B2 | 7/2014 | Yamazaki et al. |
| 9,000,443 B2 | 4/2015 | Hatano |
| 9,024,936 B2 | 5/2015 | Ogata et al. |
| 9,093,324 B2 | 7/2015 | Yamazaki et al. |
| 9,240,525 B2 | 1/2016 | Yamazaki et al. |
| 9,768,410 B2 | 9/2017 | Yamazaki et al. |
| 2004/0079941 A1 | 4/2004 | Yamazaki et al. |
| 2005/0062412 A1 | 3/2005 | Taniguchi et al. |
| 2006/0098153 A1 | 5/2006 | Slikkerveer et al. |
| 2006/0273304 A1 | 12/2006 | Cok |
| 2008/0049437 A1 | 2/2008 | Takayama et al. |
| 2008/0198578 A1 | 8/2008 | Finn |
| 2009/0021678 A1 | 1/2009 | Son et al. |
| 2009/0051640 A1 | 2/2009 | Tanaka et al. |
| 2009/0096965 A1 | 4/2009 | Nagata |
| 2009/0161048 A1 | 6/2009 | Satake et al. |
| 2009/0278449 A1 | 11/2009 | Choi et al. |
| 2010/0293782 A1 | 11/2010 | Yamazaki et al. |
| 2011/0039097 A1 | 2/2011 | Murashige et al. |
| 2011/0089811 A1 | 4/2011 | Yamazaki et al. |
| 2012/0061664 A1 | 3/2012 | Yamazaki et al. |
| 2012/0299470 A1 | 11/2012 | Kobayashi et al. |
| 2014/0347490 A1 | 11/2014 | Takayama et al. |
| 2016/0120029 A1 | 4/2016 | Murashige et al. |
| 2017/0373271 A1 | 12/2017 | Yamazaki et al. |
| 2018/0368256 A1 | 12/2018 | Murashige et al. |
| 2019/0008043 A1 | 1/2019 | Murashige et al. |

FOREIGN PATENT DOCUMENTS

| | | |
|---|---|---|
| CN | 102285166 A | 12/2011 |
| EP | 1448026 A | 8/2004 |
| JP | 01-287529 A | 11/1989 |
| JP | 07-114347 A | 5/1995 |
| JP | 08-124679 A | 5/1996 |
| JP | 11-073148 A | 3/1999 |
| JP | 2002-093586 A | 3/2002 |
| JP | 2002-117971 A | 4/2002 |
| JP | 2002-299041 A | 10/2002 |
| JP | 2003-229548 A | 8/2003 |
| JP | 2004-079432 A | 3/2004 |
| JP | 2004-140267 A | 5/2004 |
| JP | 2006-040580 A | 2/2006 |
| JP | 2006-507528 | 3/2006 |
| JP | 2006-331854 A | 12/2006 |
| JP | 2007-200692 A | 8/2007 |
| JP | 2008-235193 A | 10/2008 |
| JP | 2009-130132 A | 6/2009 |
| JP | 2009-522593 | 6/2009 |
| JP | 2009-279926 A | 12/2009 |
| JP | 2011-029176 A | 2/2011 |
| JP | 2011-171288 A | 9/2011 |
| WO | WO-2003/037041 | 5/2003 |
| WO | WO-2004/036652 | 4/2004 |
| WO | WO-2004/049050 | 6/2004 |
| WO | WO-2007/078130 | 7/2007 |
| WO | WO-2010/125976 | 11/2010 |
| WO | WO-2011/068158 | 6/2011 |
| WO | WO-2011/083620 | 7/2011 |

OTHER PUBLICATIONS

Chinese Office Action (Application No. 201611095614.8) dated May 15, 2018.

LIGHT-EMITTING DEVICE AND MANUFACTURING METHOD THEREOF

BACKGROUND OF THE INVENTION

1. Field of the Invention

The present invention relates to a light-emitting device and a manufacturing method thereof. In particular, the present invention relates to a light-emitting device with a curved surface.

2. Description of the Related Art

Research and development have been extensively conducted on organic EL (electroluminescence) elements. In the fundamental structure of the organic EL element (hereinafter, also referred to as EL element or light-emitting element), a layer containing a light-emitting organic compound is provided between a pair of electrodes. By applying voltage to this element, light emission from the light-emitting organic compound can be obtained.

The light-emitting device using the organic EL element is, for example, a lighting device, or an image display device including a combination of thin film transistors.

The organic EL element can be formed into a film shape; thus, a large-area element can be easily formed. Therefore, the organic EL element has a high utility value as a surface light source that can be applied to lighting or the like. For example, a lighting device including an organic EL element is disclosed in Patent Document 1.

In addition, an image display device using the organic EL element needs no backlight which is necessary for a liquid crystal display device and the like; therefore, thin, light-weight, high contrast, and low power consumption display devices can be obtained.

As a method for forming a layer containing a light-emitting organic compound over a lower electrode formed over a substrate having an insulating surface when the organic EL element is formed, a vacuum evaporation method, a coating method, or the like is given, for example. As a method for forming the lower electrode and the upper electrode, a vacuum evaporation method, a sputtering method, a coating method, a printing method, or the like is given.

In recent years, diversification of shape of light-emitting device has been required. One example is a light-emitting device having a curved surface. By giving a light-emitting device a curved surface, the design and general versatility are improved, so that degrees of freedom of installation location and shape of incorporated members are improved. For example, a lighting device or a display device can be incorporated along a curved surface of the interior or exterior of a building or a car. In addition, the light-emitting device can be used for various applications; a wearable lighting device or display device such as a wristband, a portable terminal such as a mobile phone and a tablet terminal having a curved display portion, and the like can be given.

REFERENCE

Patent Document

[Patent Document 1] Japanese Published Patent Application No. 2009-130132

SUMMARY OF THE INVENTION

When a lower electrode, a layer containing a light-emitting organic compound, and an upper electrode which are included in an EL element, are stacked in this order, the thickness of each layer needs to be uniform in the substrate surface. When each thickness is not uniform in the substrate surface, there might be an uneven distribution of luminance in the substrate surface. In particular, in a portion where the thickness of the layer containing a light-emitting organic compound sandwiched between the electrodes is small, the luminance might be increased or a short circuit might occur due to electric-field concentration. On the other hand, in the case where the thickness thereof is large, a voltage required for light emission is increased and thus the luminance might be decreased or a non-light-emitting region might appear.

However, it has been difficult to form the lower electrode, the layer containing a light-emitting organic compound, and the upper electrode which are included in an EL element, with uniform thickness in the case where the EL element is formed over a substrate having a curved surface. For example, in the case where a vacuum evaporation method or a sputtering method is used, the deposition rates of formed films are different depending on the distance or the angle between an evaporation source or a target and a formation surface. Further, it is very difficult to employ a coating method and a printing method for deposition of films over the substrate having a curved surface, for their apparatus structures.

The present invention is made in view of the foregoing technical background. Accordingly, one object of the present invention is to provide a light-emitting device having a curved light-emitting surface. Another object of one embodiment of the present invention is to provide a light-emitting device with high reliability.

One embodiment of the present invention achieves at least one of the above objects.

In order to achieve the above objects in the present invention, a material of a substrate over which a light-emitting element is formed is considered. A substrate with plasticity is used as the substrate. A light-emitting element is formed over the substrate being made flat. The substrate over which the light-emitting element is formed is provided while being curved, over a curved surface of a support. Then, a protective layer for protecting the light-emitting element is formed with the substrate curved.

Note that a "curved surface" in this specification means a curved surface obtained by deformation due to expansion and contraction of a flat surface. In other words, it means a curved surface on which a flat surface and a line are in contact with each other at a given point. Here, a curved surface in this specification and the like does not include a curved surface obtained by deformation without expansion and contraction of a flat surface (so-called three-dimensional curved surface).

By the above-described method, a light-emitting device such as a lighting device and a display device, having a curved light-emitting surface can be manufactured.

Owing to the substrate with plasticity, the manufactured light-emitting device can maintain its shape even when the device is separated from the support after the protective layer is formed. Thus, the light-emitting device can be used as a light-emitting device having a light-emitting surface curved along the curved surface of the support.

That is, one embodiment of the present invention is a light-emitting device including a substrate having a curved surface and with plasticity, a light-emitting element formed over the substrate surface and having a light-emitting layer between a pair of electrodes, a sealing layer covering the light-emitting element, and a protective layer over and in contact with the sealing layer.

With such a structure, a reliable light-emitting device can be provided which has a curved light-emitting surface and in which dispersion of impurities such as water from the outside is prevented by a sealing layer covering the light-emitting element and a protective layer over and in contact with the sealing layer.

Another embodiment of the present invention is a light-emitting device including a substrate having a curved surface and with plasticity, a plurality of pixels over the substrate surface, which includes a light-emitting element having a light-emitting layer between a pair of electrodes and a transistor, a sealing layer covering the light-emitting element, and a protective layer over and in contact with the sealing layer.

As described above, one embodiment of the present invention can be used for the light-emitting device (also referred to as an image display device) in which a plurality of pixels with a combination of a transistor and a light-emitting element is provided. The light-emitting device can be attached to a curved wall or ceiling of a building, a vehicle, and the like, and can achieve a good-design electronic device such as a portable device.

In any of the light-emitting devices according to another embodiment of the present invention, the substrate contains a metal material or an alloy material.

In any of the light-emitting devices according to another embodiment of the present invention, the substrate contains at least any one of aluminum, copper, iron, nickel, titanium, and magnesium.

As described above, using a metal material or an alloy material with high thermal conductivity for the substrate over which a light-emitting device is provided, heat dissipation can be increased. Accordingly, heat generation from the light-emitting device can be suppressed even after a long period of use and thus the reliability of the light-emitting device can be increased.

In any of the light-emitting devices according to another embodiment of the present invention, a planarization layer is provided between the light-emitting element and the substrate.

It is preferable to provide a planarization layer closer to a substrate than a light-emitting element because the thickness uniformity of a film included in the light-emitting element is increased. In particular, the surface of a substrate containing a metal material or an alloy material is often rough; providing a planarization layer is particularly effective.

In any of the light-emitting devices according to another embodiment of the present invention, the planarization layer contains a thermal conductivity material.

In any of the light-emitting devices according to another embodiment of the present invention, the planarization layer contains a resin in which particles containing a metal material or an alloy material are dispersed.

The planarization layer provided closer to the light-emitting element is formed using a thermal conductivity material; thus, heat dissipation of heat generated from the light-emitting element can be increased. In particular, in the case of using a thermal conductivity substrate containing a metal material or an alloy material, heat generated from the light-emitting element can be transferred to the substrate through the planarization layer; thus, heat generation from the light-emitting device can be further suppressed.

In any of the light-emitting devices according to another embodiment of the present invention, the protective layer is formed using a glass layer.

Using a glass layer as the protective layer for protecting a light-emitting element is preferable because dispersion of impurities such as water and oxygen can be significantly suppressed.

In any of the light-emitting devices according to another embodiment of the present invention, the protective layer is a stack in which a glass layer, a bonding layer, and a resin layer are stacked in this order.

When the protective layer has the structure in which a resin layer is stacked over a glass layer as described above, a crack or a break in the glass layer can be suppressed and thus the light-emitting device can have high strength. Here, it is further preferable to provide the glass layer so as to face the light-emitting element because impurity dispersion from the resin layer can be suppressed.

One embodiment of the present invention is a manufacturing method of a light-emitting device including the following steps: putting a substrate with plasticity so that one surface is flat and then stacking a first electrode, a light-emitting layer, and a second electrode in this order over the one surface of the substrate, thereby forming a light-emitting element; putting the substrate over which the light-emitting element is formed over a support having a curved surface along the curved surface of the support so that the other surface opposite to the one surface over which the light-emitting element is formed faces the support; dropping a curable material on the one surface of the substrate; putting a protective layer over the substrate in a region where the light-emitting element is not provided so that the curable material is in contact with part of an edge of the protective layer, then fixing the protective layer in a region where the protective layer is in contact with the curable material; curving the protective layer along the one surface of the substrate so that the surface of the protective layer facing the substrate is in contact with the curable material in the region where the light-emitting element is provided; and curing the curable material, thereby forming a sealing layer.

By such a method, a light-emitting device having a curved light-emitting surface can be manufactured. Since a surface over which a light-emitting element is formed is flat, the thickness uniformity of the layer included in the light-emitting element is improved and thus emission luminance in the substrate surface can be uniform. When the protective layer is provided, only the edge of the protective layer is attached first. Then, curving along the substrate surface, the protective layer is bonded to a thermosetting material which is to be a sealing layer. Thus, generation of bubbles between the protective layer and the sealing layer can be suppressed and a reliable light-emitting device can be manufactured.

Another embodiment of the present invention is a manufacturing method of a light-emitting device including the following steps: putting a substrate with plasticity so that one surface is flat and then a first electrode, a light-emitting layer, and a second electrode are stacked in this order over the one surface of the substrate, thereby forming a light-emitting element; putting the substrate over which the light-emitting element is formed over a support having a curved surface along the curved surface of the support so that the other surface opposite to the one surface over which the light-emitting element is formed faces the support; dropping a photocurable material on the one surface of the substrate; putting a protective layer over the substrate in a region where the light-emitting element is not provided so that the photocurable material is in contact with part of an edge of the protective layer, and then, irradiating the region where the protective layer is in contact with the photocurable material with light to cure part of the photocurable material, thereby forming part of a sealing layer by which the protective layer is bonded to part of the substrate; curving the protective layer along the one surface of the substrate so that the protective layer surface facing the substrate is in contact with the photocurable resin in the region where the light-emitting element is provided; and irradiating part of the photocurable material which is not cured with light, thereby forming the sealing layer.

In this method, a fixture for fixing part of the protective layer to the substrate is not needed. Thus, a light-emitting layer having a curved light-emitting surface can be easily manufactured.

Another embodiment of the present invention is a manufacturing method of a light-emitting device including the following steps: over a support substrate having a flat surface, forming a layer to be separated over the flat surface, and then, over the layer to be separated, forming a plurality of pixels including a light-emitting layer between a pair of electrodes and a transistor; separating the layer to be separated over which the pixels are formed from the support substrate and transferring the layer to be separated over which the pixels are formed to one surface of a substrate with plasticity; putting the substrate which includes the pixels over a support having a curved surface so that a surface opposite to the one surface over which the pixels are formed faces the support, curving the substrate along the curved surface of the support; dropping a curable material on the one surface of the substrate; putting a protective layer over the substrate in a region where the pixel is not provided so that the curable material is in contact with part of an edge of the protective layer, and then, fixing the protective layer in the region where the protective layer is in contact with the curable material; curving the protective layer along the one surface of the substrate so that the surface facing the protective layer substrate is in contact with the curable resin in the region where the pixels are provided; and curing the curable material, thereby forming a sealing layer.

By such a method, an image display device including a display portion which is curved and includes a plurality of pixels can be manufactured. A surface over which a light-emitting element and a transistor are formed being flat, they can be easily formed, and in addition, a reliable display device in which variation in electric characteristics is suppressed can be manufactured.

Another embodiment of the present invention is a manufacturing method of a light-emitting device including the following steps: over a support substrate having a flat surface, forming a layer to be separated over the flat surface, and then, over the layer to be separated, forming a plurality of pixels including a light-emitting layer between a pair of electrodes and a transistor; separating the layer to be separated over which the pixels are formed from the support substrate and transferring the layer to be separated over which the pixels are formed to one surface of a substrate with plasticity; putting the substrate which includes the pixels over a support having a curved surface so that a surface opposite to the one surface over which the pixels are formed faces the support, curving the substrate along the curved surface of the support; dropping a photocurable material on the one surface of the substrate; putting a protective layer over the substrate in a region where the pixels are not provided so that the photocurable material is in contact with part of an edge of the protective layer, and then, irradiating the region where the protective layer is in contact with the photocurable material with light to cure part of the photocurable material, thereby forming part of a sealing layer by which the protective layer is bonded to part of the substrate; curving the protective layer along the one surface of the substrate so that the protective layer surface facing the substrate is in contact with the photocurable resin in the region where the pixels are provided; and irradiating part of the photocurable material which is not cured with light, thereby forming the sealing layer.

In such a manner, part of the protective layer is preferably fixed using a photocurable material.

The manufactured light-emitting device can be removed from the support or can be kept held by the support. For example, it is possible that a member to be a housing of a lighting device or an electronic device is used as the support and a light-emitting device is manufactured over the support and then is incorporated in the lighting device or the electronic device.

In any of the manufacturing methods of a light-emitting device according to another embodiment of the present invention, a substrate containing a metal material or an alloy material is used as the substrate.

In any of the manufacturing methods of a light-emitting device according to another embodiment of the present invention, the substrate contains at least any one of aluminum, copper, iron, nickel, titanium, and magnesium.

As described above, when a metal material or an alloy material with high thermal conductivity is used for the substrate, a light-emitting device in which heat dissipation is increased can be manufactured. Further, a planarization film or a planarization film containing a thermal conductivity material may be provided over the substrate surface over which an element is formed.

In any of the manufacturing methods of a light-emitting device according to another embodiment of the present invention, the protective layer is formed using a glass layer.

In any of the manufacturing methods of a light-emitting device according to another embodiment of the present invention, the protective layer is a stack in which a glass layer, a bonding layer, and a resin layer are stacked in this order.

By the manufacturing method, a reliable light-emitting device in which dispersion of impurities such as water and oxygen is suppressed can be manufactured. Further, using a stack of glass and resin, a light-emitting device with high mechanical strength can be manufactured.

The term "EL layer" in this specification and the like means a layer provided between a pair of electrodes of a light-emitting element, and specifically means at least a layer containing a light-emitting organic compound (also referred to as a light-emitting layer), or a stack including the light-emitting layer.

Note that a light-emitting device in this specification refers to an image display unit, and a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to the present invention, a light-emitting device having a curved light-emitting surface can be provided. Further, a reliable light-emitting device can be provided.

DETAILED DESCRIPTION OF THE INVENTION

Figure 1A:
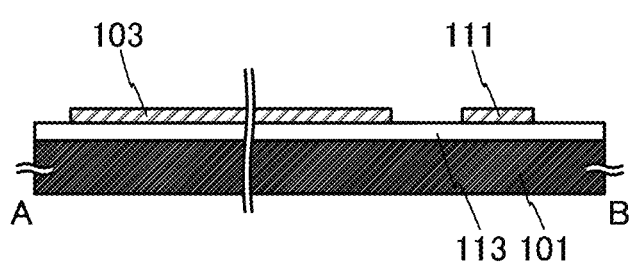
FIGS. 1A to 1D illustrate a method for manufacturing a light emitting device according to one embodiment of the present invention.
Figure 1A:
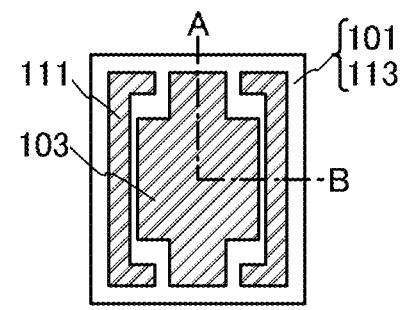

Embodiments and examples will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

(Embodiment 1)

In this embodiment, a light-emitting device according to one embodiment of the present invention and a manufacturing method thereof will be described with reference to drawings.

[Example of Manufacturing Method of Light-Emitting Device]

A manufacturing method of a light-emitting device according to one embodiment of the present invention will be described below with reference to FIGS. 1A to 1D and FIGS. 2A to 2E. FIGS. 1A to 1D and FIGS. 2A to 2E illustrate schematic top views at each stage and schematic cross-sectional views taken along line A-B in the schematic top views.

First, a substrate 101 is prepared. For the substrate 101, a material having plasticity and a substrate in which at least a formation surface is flat are used.

When a metal material or an alloy material is used for the substrate 101, heat dissipation of heat generated from a light-emitting element formed later can be increased, which is preferable. A material used for the substrate 101 may be a metal material such as aluminum, copper, iron, nickel, titanium, and magnesium or an alloy material containing the metal material. Alternatively, stainless or duralumin may be used.

A substrate to which insulation treatment is performed is preferably used. For example, a surface of a conductive substrate is oxidized or an insulating film is formed over a substrate surface. An insulating film may be formed by, for example, an electrodeposition method, a coating method such as a spin-coating method and a dipping method, an evaporation method, or a sputtering method. An oxide film may be formed over the substrate 101 surface by a known method such as an anodic oxidation method, exposing to or heating in an oxygen atmosphere, or the like.

Then, a planarization layer 113 is formed over the formation surface of the substrate 101. The planarization layer 113 is formed in order to cover and planarize the unevenness of the surface of the substrate 101. For the planarization layer 113, an insulating material can be used; an organic material such as a polyimide-, an acrylic-, an epoxy-, a benzocyclobutene-based resin, for example.

The planarization layer 113 can be formed by a coating method such as a spin-coating method or a dipping method, a discharging method such as an ink-jet method or a dispensing method, a printing method such as a screen printing method, or the like.

An organic resin in which particles containing a metal material or an alloy material are dispersed can be used for the planarization layer 113. In such a manner, when the planarization layer 113 in which conductive materials are dispersed is used, heat generated from a light-emitting element formed later can be effectively transferred to the substrate 101 and thus a heat dissipation property is further increased. In order to increase a planarization property or an insulation property, an organic resin may be further stacked over the organic resin in which conductive particles are dispersed.

Note that when the surface of the substrate 101 is subjected to insulation treatment and the planarization property thereof is high, the planarization layer 113 is not necessarily provided.

Next, a first electrode layer 103 and a wiring 111 are formed over the planarization layer 113.

Part of the first electrode layer 103 serves as one electrode of the light-emitting element. The wiring 111 is a wiring for supplying electric power to a second electrode of the light-emitting element which is formed later. Here, each part of the first electrode layer 103 and the wiring 111 also serves as an extraction electrode for supplying electric power.

The first electrode layer 103 and the wiring 111 may be formed of the same material or different material. At least a region over the first electrode layer 103 where a light-emitting element is formed is formed using a material that reflects light emission from an EL layer 105 formed later. A material having high reflective properties, which is different from that of the first electrode layer 103, may be stacked in the region over the first electrode layer 103 where a light-emitting element is formed.

As examples of the material used for the first electrode layer 103 and the wiring 111, a metal material such as aluminum, gold, platinum, silver, nickel, tungsten, chromium, molybdenum, iron, cobalt, copper, or palladium or an alloy containing any of these metal materials can be given. Alternatively, lanthanum, neodymium, germanium, or the like may be added to a metal material or an alloy material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. As examples of a material for the metal film or the metal oxide film, titanium, titanium oxide, and the like are given. Alternatively, the conductive layer may be a stack of a film containing any of the above light-transmitting materials and a film containing any of the above metal materials. For example, a stacked film of silver and indium oxide-tin oxide, a stacked film of a silver-magnesium alloy and indium oxide-tin oxide, or the like can be used.

The first electrode layer 103 and the wiring 111 can be formed by a sputtering method, a vacuum evaporation method, a printing method such as a screen printing method, a discharging method such as an ink-jet method or a dispensing method, a plating method, or the like. In particular, they are preferably formed at the same time using a screen printing method.

FIG. 1A illustrates a schematic top view and a schematic cross-sectional view at this stage.

Next, an insulating layer 115 is formed which covers part of end portions of the first electrode layer 103 and the wiring 111 and which has an opening portion through which parts of the first electrode layer 103 and the wiring 111 are exposed.

The insulating layer 115 can be formed by a discharging method such as an ink-jet method or a dispensing method, a printing method such as a screen printing method, or the like. Alternatively, a photolithography method may be used.

An upper end portion or a lower end portion of the insulating layer 115 preferably has a curved surface with a curvature radius of 0.2 μm to 3 μm in order to be adequately covered with the second electrode layer 107 formed later. The insulating layer 115 can be formed using a material similar to that of the planarization layer 113, an organic compound such as a negative photosensitive resin or a positive photosensitive resin, or an inorganic compound such as silicon oxide or silicon oxynitride.

Figure 1B:
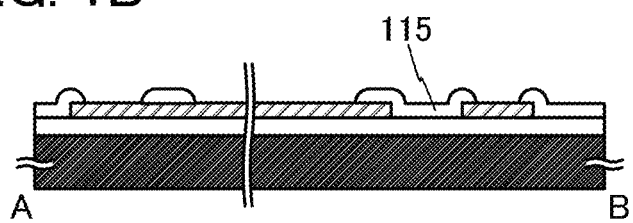
Figure 1B:
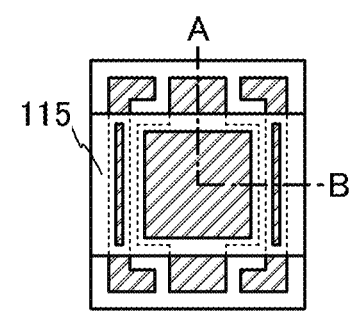

FIG. 1B illustrates a schematic top view and a schematic cross-sectional view at this stage.

Next, the EL layer 105 is formed over the first electrode layer 103. The EL layer 105 is formed by a vacuum evaporation method, a discharging method such as an ink-jet method or a dispensing method, or a coating method such as a spin-coating method.

The EL layer 105 includes at least a layer containing a light-emitting organic compound (hereinafter, also referred to as a light-emitting layer), and may be either a single-layer structure or a stacked-layer structure. As the structure in which a plurality of layers is stacked, a structure in which an anode, a hole injection layer, a hole transport layer, a light-emitting layer, an electron transport layer, and an electron injection layer are stacked in this order can be given as an example. Note that not all of these layers except the light-emitting layer are necessarily provided in the EL layer 105. Further, each of these layers may be provided in duplicate or more. Specifically, in the EL layer 105, a plurality of light-emitting layers may overlap with each other or another hole injection layer may overlap with the electron injection layer. Furthermore, another component such as an electron-relay layer may be added as appropriate as an intermediate layer, in addition to the charge generation layer. Alternatively, a plurality of light-emitting layers exhibiting different colors may be stacked each other. For example, a white emission can be obtained by stacking two or more light-emitting layers of complementary colors.

Figure 1C:
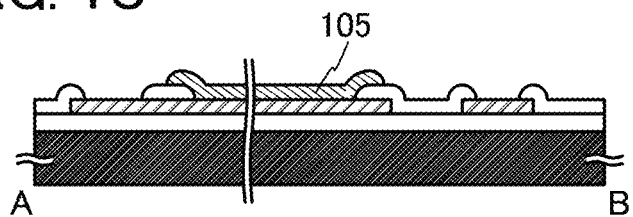
Figure 1C:
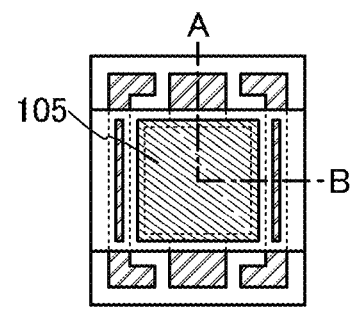

FIG. 1C illustrates a schematic top view and a schematic cross-sectional view at this stage.

The second electrode layer 107 covering the EL layer 105 and electrically connected to the wiring 111 is formed.

A material having a property of transmitting light emitted from the EL layer 105 is used for the second electrode layer 107.

As the light-transmitting material, a conductive oxide such as indium oxide, indium oxide-tin oxide, indium oxide-zinc oxide, zinc oxide, and zinc oxide to which gallium is added can be used. Further, graphene may be used. Other examples are a metal material such as gold, silver, platinum, magnesium, nickel, tungsten, chromium, molybdenum, iron, cobalt, copper, palladium, and titanium; and an alloy material containing any of these metal materials. Further alternatively, nitride of the metal material (e.g., titanium nitride) or the like may be used. In the case of using the metal material (or the nitride thereof), the conductive layer may be thinned so as to be able to transmit light. Alternatively, a stack of any of the above materials can be used as the conductive layer. For example, a stacked film of a silver-magnesium alloy and indium oxide-tin oxide is preferably used, in which case electrical conductivity can be increased.

The second electrode layer 107 is formed by a vacuum evaporation method, a sputtering method, or the like. A discharging method such as an ink-jet method, a printing method such as a screen printing method, or a plating method may be used.

Note that when the above conductive oxide film having a light-transmitting property is formed by a sputtering method, the use of a deposition atmosphere containing argon and oxygen allows the light-transmitting property to be increased.

Further, in the case where the conductive oxide film is formed over the EL layer, it is preferable to stack a first conductive oxide film formed under an atmosphere containing argon with a reduced oxygen concentration and a second conductive oxide film formed under an atmosphere containing argon and oxygen because film formation damage to the EL layer can be reduced. Here, the purity of an argon gas used for formation of the first conductive oxide film is preferably high, and for example, it is preferable to use the argon gas whose dew point is lower than or equal to −70° C., more preferably lower than or equal to −100° C.

In this manner, a light-emitting element 120 in which the first electrode layer 103, the EL layer 105, and the second electrode layer 107 are stacked is formed. Here, the structure formed over the substrate 101 is collectively referred to as a light-emitting unit 110.

In each of the process for forming the light-emitting unit 110, the formation surface of the substrate 101 is put so that the formation surface is flat. Thus, thickness, shape, position, and the like of each layer included in the light-emitting unit 110 can be well controlled. In particular, each thickness of the first electrode layer 103, the EL layer 105, and the second electrode layer 107 which are included in the light-emitting element 120 can be uniform; thus, a light-emitting device with high luminance uniformity can be manufactured.

A protective film may be formed over the second electrode layer 107. By forming a protective film, dispersion of impurities such as water and oxygen into the light-emitting element 120 can be suppressed. and thus a light-emitting device with high reliability can be provided. For the protective film, a material with a light-transmitting property and a barrier property against water and oxygen is used; a semiconductor such as silicon or oxide or nitride of metal such as aluminum may be used, for example.

Figure 1D:
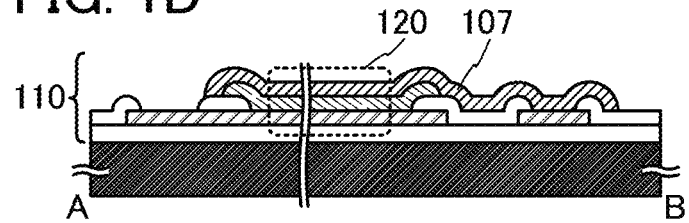
Figure 1D:
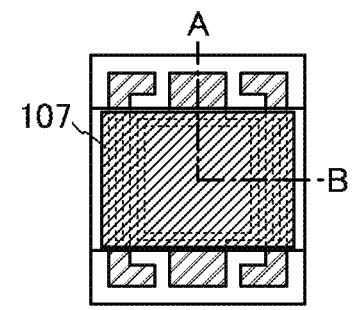

FIG. 1D illustrates a schematic top view and a schematic cross-sectional view at this stage.

Figure 2A:
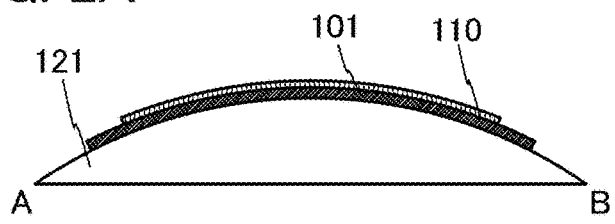
FIGS. 2A to 2E illustrate a method for manufacturing a light-emitting device according to one embodiment of the present invention.
Figure 2A:
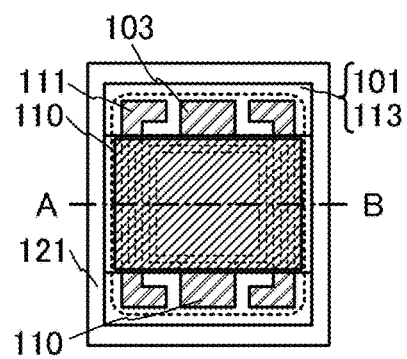

Next, the substrate 101 over which the light-emitting unit 110 is formed is provided over a support 121 as illustrate in FIG. 2A. For clarity, the light-emitting unit 110 is simplified in the following drawings.

The support 121 has a curved surface. The cross section of the support 121 preferably has a continuous curve. The support 121 in FIG. 2A has a projected arc-shaped cross section. Other than that, a variety of shapes can be possible; a depressed arc-shaped cross section, a wave-like cross section, or the like.

The substrate 101 is provided along the curved surface of the support 121. Since the substrate 101 has plasticity, the curved shape can be maintained after the substrate 101 is provided along the curved surface of the support 121.

The support 121 and the substrate 101 may be fixed by an adhesive material or a fixture. Note that in the case where a light-emitting device 100 is detached from the support 121, a low-viscosity adhesive material or a detachable fixture is used.

Here, the curvature radius of the support 121 can be set so that a crack or a break does not occur in each layer included in the light-emitting unit 110 when the substrate 101 is curved. Further, as each layer included in the light-emitting unit 110 is thinner, a support with a smaller curvature radius can be used.

Figure 2B:
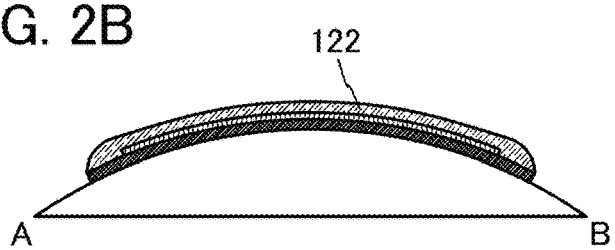
Figure 2B:
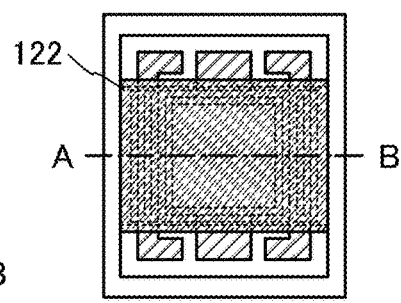

Next, a sealant 122 is applied on the curved substrate 101 (FIG. 2B). The sealant 122 is formed by, for example, dropping a material used for the sealant 122 on at least a region covering the light-emitting element 120 and a region where a protective layer is formed later. At this time, the sealant 122 is applied so as to expose a region of the first electrode layer 103 and the wiring 111 which serves as an extraction electrode provided at the periphery of the substrate 101.

A photocurable organic resin is used as the sealant 122. In addition, as the sealant 122, a material which transmits at least light emitted from a light-emitting element after the sealant 122 is cured by light irradiation is used.

For example, PVC (polyvinyl chloride), acrylic, polyimide, an epoxy resin, a silicone resin, PVB (polyvinyl butyral), EVA (ethylene vinyl acetate), or the like can be used for the sealant 122.

Figure 2C:
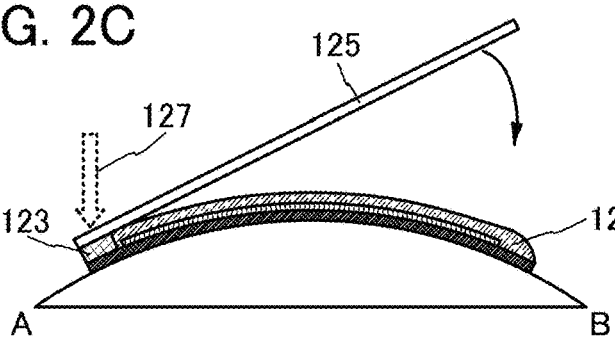
Figure 2C:
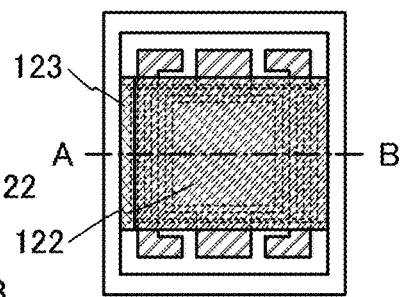

Next, a protective layer 125 is formed in contact with part of the sealant 122 (FIG. 2C).

The protective layer 125 is formed using a material that transmits at least light emitted from the light-emitting element 120; a seat-like organic resin or a glass material with thickness enough to have flexibility, for example.

The protective layer 125 may be formed by stacking a plurality of layers. When a glass layer is used, a barrier property against water and oxygen can be improved and thus a reliable light-emitting device can be provided.

In particular, a sheet in which a glass layer, a bonding layer, and an organic resin layer are stacked from the side closer to a light-emitting element is preferably used for the protective layer 125. The thickness of the glass layer is greater than or equal to 20 μm and less than or equal to 200 μm, preferably greater than or equal to 25 μm and less than or equal to 100 μm. With such a thickness, the glass layer can have both a high bather property against water and oxygen and a high flexibility. The thickness of the organic resin layer is greater than or equal to 10 μm and less than or equal to 200 μm, preferably greater than or equal to 20 μm and less than or equal to 50 μm. Providing such organic resin layer outside the glass layer, occurrence of a crack or a break in the glass layer can be suppressed and mechanical strength can be improved. Forming the protective layer 125 by such a composite material of a glass material and an organic resin, a light-emitting device having a curved light-emitting surface and with high reliability can be provided.

First, the protective layer 125 is provided so that the end portion thereof is in contact with the sealant 122, at least in a region of the substrate 101 outside the region where the light-emitting element 120 is provided. Here, the protective layer 125 other than the end portion thereof is preferably not in contact with the sealant 122 as illustrated in FIG. 2C.

Next, the region where the protective layer 125 is in contact with the sealant 122 is irradiated with light 127. The sealant 122 in this region is cured, whereby the substrate 101 is bonded to the protective layer 125. Here, part of the cured sealant 122 becomes a sealing layer 123.

Then, the protective layer 125 is tightly attached to the sealant 122, while being curved gradually using the region where the protective layer 125 is bonded to the sealing layer 123 as a supporting point. The end portion of the protective layer 125 is bonded first, and then the protective layer 125 is gradually attached to the sealant 122 from the bonded portion toward the outside; thus, entry of air bubbles and the like is suppressed. In this manner, a light-emitting device with high reliability can be provided.

When the protective layer 125 is bonded to the sealant 122, it is preferable that a roller pressing member or the like be rolled from the bonded portion (a starting point). At this time, it is preferable to maintain a certain distance between the protective layer 125 and the substrate 101.

Figure 2D:
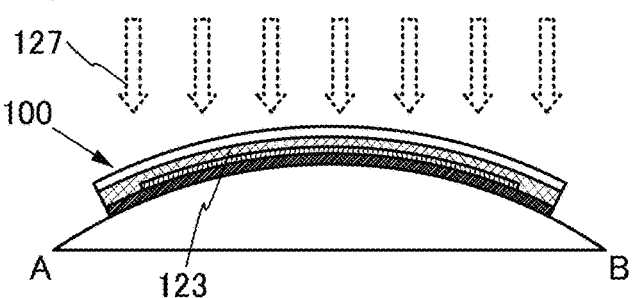
Figure 2D:
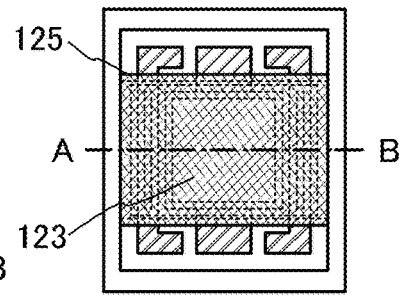

Next, the sealant 122 is irradiated with the light 127 from above the protective layer 125 as illustrated in FIG. 2D, whereby the sealant 122 is cured and the sealing layer 123 is formed.

At this time, the sealant 122 may be irradiated with the light 127 while the protective layer 125 is fixed so as not to be peeled off.

Through the above steps, the light-emitting device 100 with the curved light-emitting surface can be formed over the support 121.

Although a photocurable organic resin is used as the material of the sealant 122, a material is not limited thereto; a thermosetting organic resin, a two-component-mixture-type resin which is cured at room temperature, or the like can be used.

When the thermosetting resin is used as the sealant 122, part of the protective layer 125 is tightly attached to the sealant 122, and then the bonded portion is locally heated and cured. Then, the protective layer 125 is curved and tightly attached to the sealant 122, and is entirely heated and cured. As a method for locally heating the portion, locally irradiating with light of a lamp, moving a heat source such as a heater close to the portion, or the like is given. To heat the entire layer, a lamp, a heater, a hot plate, an oven, and the like can be used.

In the case where a resin cured at room temperature is used as the sealant 122, the region of the sealant 122 outside the region where the light-emitting element 120 is provided is coated with the resin in advance, and the resin is cured tightly attaching to the part of the protective layer 125. A resin is applied again to the region overlapping with the light-emitting element 120, and the protective layer 125 is curved and tightly attached to the resin, then is cured.

Although a method is described above in which the protective layer 125 is bonded to the substrate 101 by curing the sealant 122 tightly attached to the protective layer 125 in the region outside the region where the light-emitting element 120 is provided, there is no limitation thereon. Another method can be used as long as the position of the protective layer 125 is fixed in the region at least when the protective layer 125 is curved.

For example, the following method may be used: the sealant 122 is applied on the substrate 101; the protective layer 125 is tightly attached to the sealant 122 in the region outside the region where the light-emitting element 120 is provided; the protective layer 125 is curved while the end portion of the protective layer 125 is fixed to the substrate 101 and is tightly attached to the sealant 122; and the entire sealant 122 is cured. As a method for fixing the end portion of the protective layer 125 to the substrate 101, the following can be given: a method in which the protective layer 125 is pressed from above using a pressing member, a method in which the support 121 or the substrate 101 is directly fixed to the end portion of the protective layer 125 using a fixture such as tape, or the like.

When such a method is used, the curable material of the sealant 122 is not limited; a photocurable resin, a thermosetting resin, a curable resin cured at room temperature, or the like.

Figure 2E:
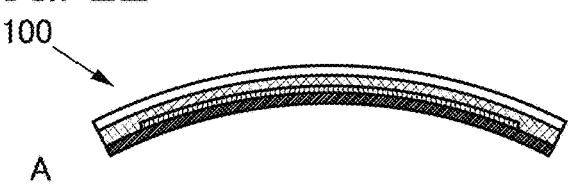
Figure 2E:
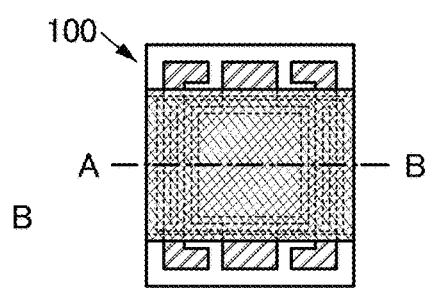

Note that the light-emitting device 100 may be supported with the support 121 as illustrated in FIG. 2D or may be detached from the support 121 as illustrated in FIG. 2E.

In the case where the light-emitting device 100 is supported with the support 121, a light-emitting device 100 may be manufactured over the support 121, using a member to be a housing of a lighting device or an electronic device as the support 121 and then may be incorporated into the lighting device or the electronic device.

As described above, using a material having plasticity for the substrate 101, the light-emitting unit 110 can be formed over the substrate 101 with the formation surface flat. Accordingly, a light-emitting device in which luminance distribution is improved can be provided.

Further, the substrate 101 and the protective layer 125 can be attached to each other while being curving, stress due to the protective layer 125 generated after the adhesion can be relieved. For example, in the case where the adhesion is performed with the protective layer 125 flat and then the entire light-emitting device 100 is curved, stress is applied to the protective layer 125 itself or a sealing layer or a light-emitting device fixed to the protective layer 125, so that a crack or a break is formed in them. Whereas, by bonding a protective layer while it is curved as described above, such a stress can be relieved and a reliable light-emitting device can be provided.

In particular, in the case where a material containing a glass layer is used for a sealing layer, there is a high possibility of occurrence of a crack when the layer is largely curved after adhesion in a flat state even when the sealing layer itself has flexibility. This is because the sealing layer is bonded to the substrate and stress applied to the glass layer is increased. On the other hand, when the above-described method is used, there is no possibility of a crack even when the layer is largely curved because the sealing layer is not bonded to a substrate when the sealing layer is curved. As a result, a reliable light-emitting device which has a light-emitting surface with a small radius of curvature and in which dispersion of impurities is suppressed by a glass layer can be achieved.

[Modification Example]

Figure 3:
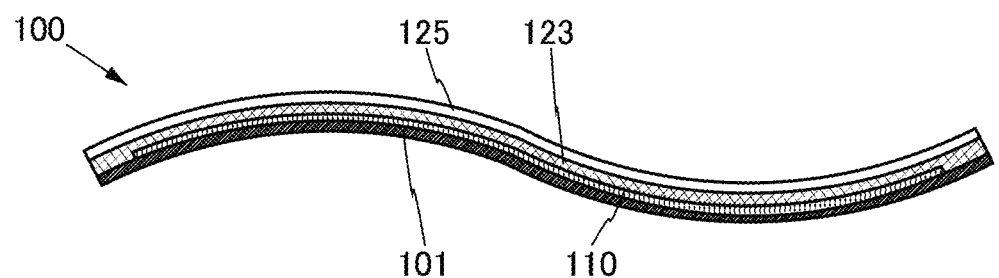
FIG. 3 illustrates a light-emitting device according to one embodiment of the present invention.

By changing the shape of the support 121, light-emitting devices having a variety of shapes can be easily manufactured. For example, a wave-shaped light-emitting device 100 as illustrated in FIG. 3 can be provided.

The light-emitting unit 110 has a square top surface in this embodiment. A light-emitting device can take a variety of shapes. Examples of such a shape includes, without limitation thereon, a circle figure including an oval figure, a polygon, a figure drawn with a curve of different curvatures, a figure drawn with a curve and a straight line, and the like, leading to improvement in design.

Further, since a seat-like material can be used for the substrate 101 and the protective layer 125, it is suitable for a Roll-To-Roll method. Accordingly, a large light-emitting device can be easily manufactured.

Note that this embodiment can be combined with any of the other embodiments and examples described in this specification as appropriate.

(Embodiment 2)

In this embodiment, the method for manufacturing a light-emitting device exemplified in the above embodiment will be described with reference to drawings. Here, an image display unit is used as a light-emitting unit.

In the description below, the description of the same content as in Embodiment 1 is sometimes omitted or simplified.

An image display unit formed over the substrate 101 with plasticity includes a plurality of pixels each of which has at least one light-emitting element. As the image display unit, there are a passive matrix image display unit in which one pixel includes one light-emitting element and an active matrix image display unit in which one pixel includes a light-emitting element and at least one transistor.

An active matrix image display device will be described below as an example of an image display device which can be applied to the method for manufacturing a light-emitting device of one embodiment of the present invention.

[Structure Example]

Figure 4A:
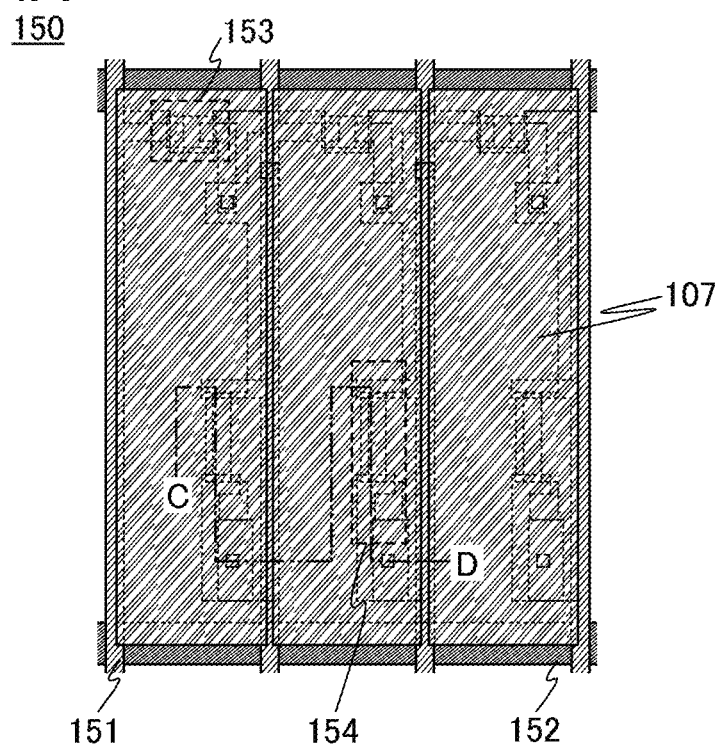
FIGS. 4A and 4B illustrate a light-emitting device according to one embodiment of the present invention.
Figure 4B:
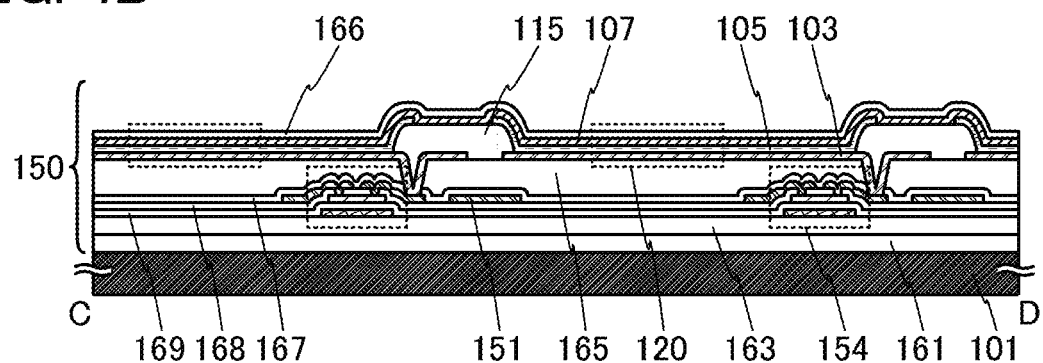

FIG. 4A illustrates part of a pixel of an image display unit 150. FIG. 4B is a schematic cross-sectional view taken along line C-D in FIG. 4A.

In the image display unit 150 illustrated in FIG. 4A, a plurality of source wirings 151 is arranged in parallel to each other and apart from each other, and a plurality of gate wirings 152 crossing the source wirings 151 is arranged in parallel to each other and apart from each other. A region surrounded by the source wiring 151 and the gate wiring 152 is one pixel of the image display unit 150. The regions are arranged in matrix.

Each pixel includes a transistor 153, a transistor 154, and a light-emitting element 120 formed over the transistor 154.

As the substrate 101, a substrate similar to that in Embodiment 1 can be used.

FIG. 4B is a schematic cross-sectional view illustrating the substrate 101, an bonding layer 161 provided over the substrate 101, an insulating layer 163 provided over the bonding layer 161, the transistor 154 formed over the insulating layer 163, and the light-emitting element 120 electrically connected to the transistor 154.

The transistor 154 includes a gate electrode layer, a gate insulating layer, a semiconductor layer, and source and drain electrode layers.

There is no particular limitation on the structure of the transistor included in the image display unit 150. For example, a forward staggered transistor or an inverted staggered transistor may be used. Further, a top-gate transistor or a bottom-gate transistor may be used.

As a semiconductor material used for the transistors, for example, a semiconductor material such as silicon or germanium or an oxide semiconductor material containing at least one of indium, gallium, and zinc can be used. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used because deterioration of the transistor characteristics can be suppressed.

The light-emitting element 120 can have the structure similar to that in Embodiment 1; the first electrode layer 103, the EL layer 105, and the second electrode layer 107 are stacked in this order. The first electrode layer 103 is electrically connected to the source electrode layer or the drain electrode layer of the transistor 154 through an opening provided in the insulating layer 165 and the insulating layer 167.

An insulating layer 166 covering the light-emitting element 120 is formed. The insulating layer 166 is formed for suppressing the dispersion of impurities such as water and oxygen into a light-emitting element. For example, an inorganic insulating material such as oxide or nitride of a semiconductor such as silicon or of a metal such as aluminum can be used.

The light-emitting elements 120 of adjacent pixels each include the EL layer 105 exhibiting different colors. For example, when the light-emitting elements 120 include the EL layers 105 exhibiting respective light of red (R), green (G), and blue (B), the full-color image display unit 150 can be provided. In addition to these three colors, the light-emitting element 120 including the EL layer 105 exhibiting light of yellow (Y) or white (W) may be provided.

An insulating layer 115 is formed to cover the opening provided in the insulating layer 165 and the insulating layer 167 and an end portion of the first electrode layer 103. The insulating layer 115 can have a structure similar to that in Embodiment 1.

The insulating layer 165 functions as a planarization layer for suppressing the influence of roughness due to the transistors and the like provided therebelow. The insulating layer 165 can suppress a short circuit or the like of the light-emitting element 120. The insulating layer 165 can be formed using a photosensitive organic resin or the like.

The insulating layers 168 and 169 which are in contact with the semiconductor layer in the transistors, and the insulating layer 167 which covers the transistors preferably reduce dispersion of impurities into the semiconductor included in the transistors. These insulating layers can be formed using, for example, oxide or nitride of a semiconductor such as silicon, oxide or nitride of metal such as aluminum. Alternatively, a stacked film of such an inorganic insulating material or a stacked film of such an inorganic insulating material and an organic insulating material may be used.

An insulating material can be used for the bonding layer 161. The bonding layer 161 has a function of covering the surface roughness of the substrate 101, like the planarization layer 113 exemplified in Embodiment 1. When the bonding layer 161 contains an organic resin in which particles containing a metal material or an alloy material are dispersed, heat generated from the light-emitting element 120 can be effectively transferred to the substrate 101 and thus a heat dissipation property can be further increased.

The above is the description of the structure example of the image display unit 150.

[Example of Manufacturing Method]

A method for manufacturing the image display unit 150 will be described below with reference to drawings.

Figure 5A:
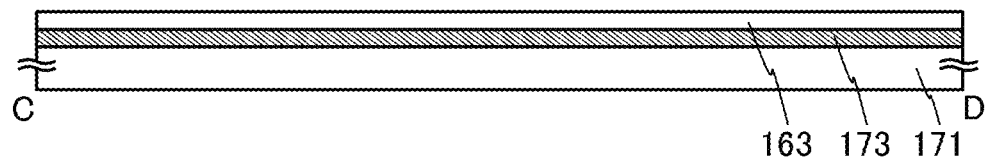
FIGS. 5A to 5D illustrate a method for manufacturing a light-emitting device according to one embodiment of the present invention.

First, a separation layer 173 and the insulating layer 163 are stacked in this order over a support substrate 171 (FIG. 5A). It is preferable that the insulating layer 163 be successively formed without exposure to the air after the separation layer 173 is formed; thus, entry of impurities can be suppressed.

A substrate having a flat surface can be used as the support substrate 171; a substrate of glass, quartz, sapphire, ceramic, metal, and the like. Having heat resistance to temperature in the manufacturing process, the support substrate 171 may be a substrate of an organic resin such as plastic. In the case of a plastic substrate, the separation layer 173 is not necessary in some cases.

Although the separation layer 173 is formed in contact with the support substrate 171 in this embodiment, it is further preferable to form an insulating layer such as a silicon oxide film, a silicon oxynitride film, a silicon nitride film, or a silicon nitride oxide film between the support substrate 171 and the separation layer 173, in the case of using a glass substrate as the support substrate 171, in order to prevent contamination from the substrate.

The separation layer 173 has a single-layer structure or a stacked-layer structure containing a metal material selected from tungsten, molybdenum, titanium, tantalum, niobium, nickel, cobalt, zirconium, ruthenium, rhodium, palladium, osmium, or iridium; an alloy material containing any of the metal materials; a compound material containing any of the metal materials; or a material containing silicon. A crystal structure of a layer containing silicon may be amorphous, microcrystal, or polycrystal.

The separation layer 173 can be formed by a sputtering method, a plasma CVD method, a coating method, a printing method, or the like. Note that the coating method includes a spin-coating method. Other than that, a droplet discharging method, a dispensing method, or the like may be used.

When the separation layer 173 has a single-layer structure, a tungsten layer, a molybdenum layer, or a layer containing a mixture of tungsten and molybdenum is preferably formed. Alternatively, a layer containing oxide or oxynitride of tungsten, a layer containing oxide or oxynitride of molybdenum, or a layer containing oxide or oxynitride of a mixture of tungsten and molybdenum is formed. Note that the mixture of tungsten and molybdenum corresponds to, for example, an alloy of tungsten and molybdenum.

When the separation layer 173 has a stacked-layer structure including a layer containing tungsten and a layer containing oxide of tungsten, the following may be utilized when the layer containing tungsten is formed and an insulating layer formed of oxide is formed thereover: the layer containing oxide of tungsten is formed at the interface between the layer containing tungsten and the insulating layer. Alternatively, the layer containing oxide of tungsten may be formed by performing thermal oxidation treatment, oxygen plasma treatment, treatment with a highly oxidizing solution such as ozone water, or the like on the surface of the layer containing tungsten. Further, plasma treatment or heat treatment may be performed in an atmosphere of oxygen, nitrogen, nitrous oxide alone, or a mixed gas of any of these gasses and another gas. Surface condition of the separation layer 173 is changed by the plasma treatment or heat treatment, whereby adhesion between the separation layer 173 and the insulating layer 163 formed later can be controlled.

Next, the insulating layer 163 is formed over the separation layer 173. The insulating layer 163 is preferably formed using a single layer or a stacked layer of silicon nitride, silicon oxynitride, silicon nitride oxide, or the like.

The insulating layer 163 can be formed by a sputtering method, a plasma CVD method, a coating method, a printing method, or the like. For example, the insulating layer 163 is formed at a deposition temperature of higher than or equal to 250° C. and lower than or equal to 400° C. by a plasma CVD method, whereby a dense film having very low water permeability can be obtained. Note that the insulating layer 163 is preferably formed to have a thickness of greater than or equal to 10 nm and less than or equal to 3000 nm, further preferably greater than or equal to 200 nm and less than or equal to 1500 nm.

Next, the transistor 153 (not shown), the transistor 154, the source wiring 151, the gate wiring 152 (not shown), and the like are formed over the insulating layer 163. Here, bottom-gate transistors are manufactured.

First, a gate electrode layer is formed in the following manner: a conductive film to be the gate electrode layer is formed and then unnecessary portions of the conductive film are removed by a known photolithography method. At the same time, a wiring and the like are also formed here, which are formed by processing the conductive film which is used to form the gate electrode layer.

The gate electrode layer can be formed using a single layer or a stacked layer of a metal material such as molybdenum, titanium, chromium, tantalum, tungsten, aluminum, copper, neodymium, or scandium, or an alloy material containing any of these metal materials.

Then, the insulating layer 169 to be the gate insulating layer is formed over the gate electrode layer. The insulating layer 169 can be formed using a single layer or a stacked layer of silicon oxide, silicon nitride, silicon oxynitride, silicon nitride oxide, or aluminum oxide by a plasma CVD method, a sputtering method, or the like. For example, a silicon oxynitride film is formed using a deposition gas containing $SiH_4$ and $N_2O$ by a plasma CVD method.

Next, a semiconductor film is formed and is processed into an island-shaped semiconductor layer by a photolithography method.

The semiconductor film can be formed using a material such as a silicon semiconductor or an oxide semiconductor. Single crystal silicon, polycrystalline silicon, microcrystal silicon, or the like are given as a silicon semiconductor. An oxide semiconductor containing at least any one of In, Ga, and Zn can be used as an oxide semiconductor, for example. Typically, an In—Ga—Zn-based metal oxide can be given. Here, the semiconductor layer is formed using an In—Ga—Zn-based metal oxide which is an oxide semiconductor to have lower carrier density, whereby an off-state leakage current of a light-emitting element formed later can be reduced, which is preferable.

Next, an insulating film covering the semiconductor layer is deposited, and then the insulating layer 168 having an opening through which part of the semiconductor layer is exposed is formed by a photolithography method.

Then, a conductive film is formed to form a source electrode and a drain electrode by a photolithography method. At the same time, a wiring and the like are also formed here by processing the conductive film used to form the source electrode layer and the drain electrode layer.

As the conductive film used for the source electrode layer and the drain electrode layer, for example, a thin film of a metal material selected from Al, Cr, Cu, Ta, Ti, Mo, and W, a thin film of a metal nitride material containing any of the above metal materials (e.g., titanium nitride, molybdenum nitride, or tungsten nitride), or the like can be used. Alternatively, a film of a high-melting-point metal such as Ti, Mo, or W or a metal nitride film of any of these elements (e.g., a titanium nitride film, a molybdenum nitride film, or a tungsten nitride film) may be stacked on one or both of a bottom side and a top side of a metal film of Al, Cu, or the like. Alternatively, the conductive film used as the source electrode layer and the drain electrode layer may be formed using a conductive metal oxide. As the conductive metal oxide, indium oxide ($In_2O_3$ or the like), tin oxide ($SnO_2$ or the like), zinc oxide (ZnO), indium oxide-tin oxide ($In_2O_3$—$SnO_2$ or the like), indium oxide-zinc oxide ($In_2O_3$—ZnO or the like), or any of these metal oxides containing silicon oxide can be used.

Through the above steps, the transistor 154 is formed.

Next, the insulating layer 167 is formed over the semiconductor layer and the source electrode layer and the drain electrode layer. As the insulating layer 167, an inorganic insulating film such as a silicon oxide film, a silicon oxynitride film, an aluminum oxide film can be used.

Figure 5B:
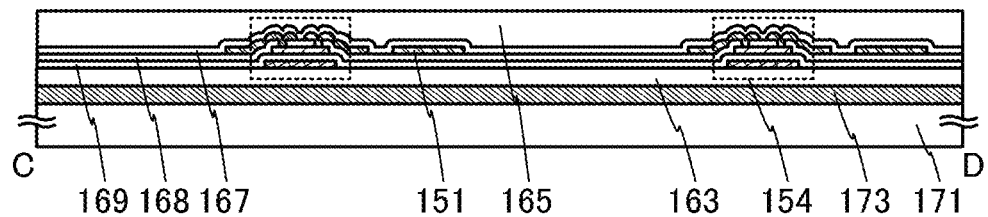

The insulating layer 165 is formed over the insulating layer 167 (see FIG. 5B).

As the insulating layer 165, an insulating film with a planarization function is preferably selected in order to reduce surface unevenness due to the transistor. For example, an organic material such as a polyimide-, an acrylic-, or a benzocyclobutene-based resin can be used. Other than such organic materials, it is also possible to use a low-dielectric constant material (a low-k material) or the like. The insulating layer 165 may be formed by stacking plural insulating films formed using any of these materials.

An opening reaching the source electrode layer or the drain electrode layer is formed in the insulating layer 165 and the insulating layer 167 by a photolithography method. As a method for forming the opening, a dry etching method, a wet etching method, or the like is selected as appropriate. It is possible that the insulating layer 165 having an opening is formed by a photolithography method, using a photosensitive material for the insulating layer 165, and then the insulating layer 167 is partly etched using the insulating layer 165 as masks to form an opening. It is also possible that, after the insulating layer 167 is formed in advance, an opening is formed in the insulating layer 167, and then, the insulating layer 165 having an opening is formed.

Next, a conductive film is formed over the insulating layer 165 to form a first electrode layer 103 by a photolithography method, which is electrically connected to the source electrode layer or the drain electrode layer of the transistor 154.

Figure 5C:
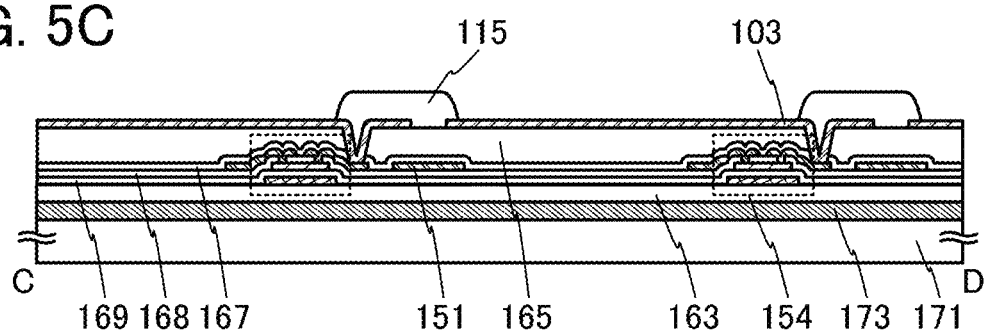

Next, the insulating layer 115 covering an end portion of the first electrode layer 103 and an opening formed in the insulating layer 165 is formed (see FIG. 5C).

Then, the EL layer 105 is formed over the first electrode layer 103. The EL layers 105 are selectively formed by an evaporation method using metal masks, exhibiting different emission colors in adjacent pixels.

A structure for full-color display may be possible; an EL layer exhibiting white light is used in common as the EL layer 105, and color filters which transparent different colors are provided above the light-emitting elements 120 of adjacent pixels. In that case, a color filter is formed over the insulating layer 166 or, in advance, over an entire surface of the protective layer 125 exemplified in Embodiment 1. When the white-light-emitting EL layer is used in common, metal masks for separately forming EL layers for different colors in the pixels are not needed, which is preferable.

Next, the second electrode layer 107 is formed over the EL layer 105.

Note that one of the first electrode layer 103 and the second electrode layer 107 functions as an anode of the light-emitting element 120, and the other functions as a cathode of the light-emitting element 120. It is preferable to use a substance having a high work function for the electrode which functions as an anode, and a substance having a low work function for the electrode which functions as a cathode.

Through the above steps, the light-emitting element 120 is formed.

Figure 5D:
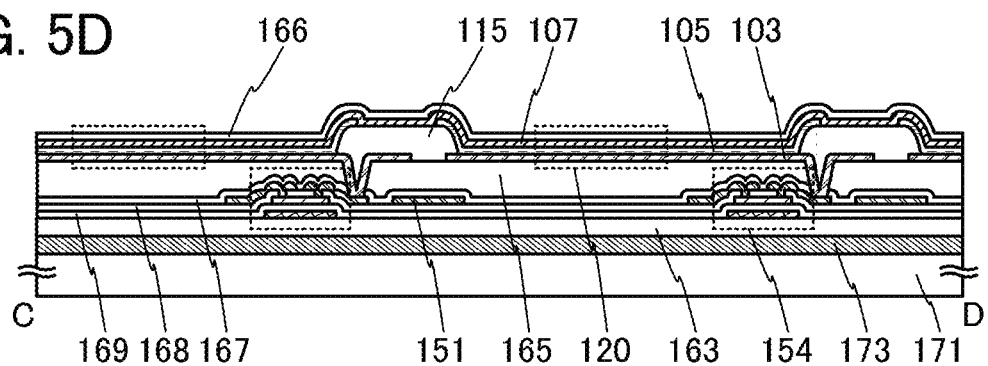

Lastly, the insulating layer 166 covering the second electrode layer 107 is formed (see FIG. 5D).

Through the above process, a transistor, a wiring, and the light-emitting element 120 can be formed over the support substrate 171.

Figure 6A:
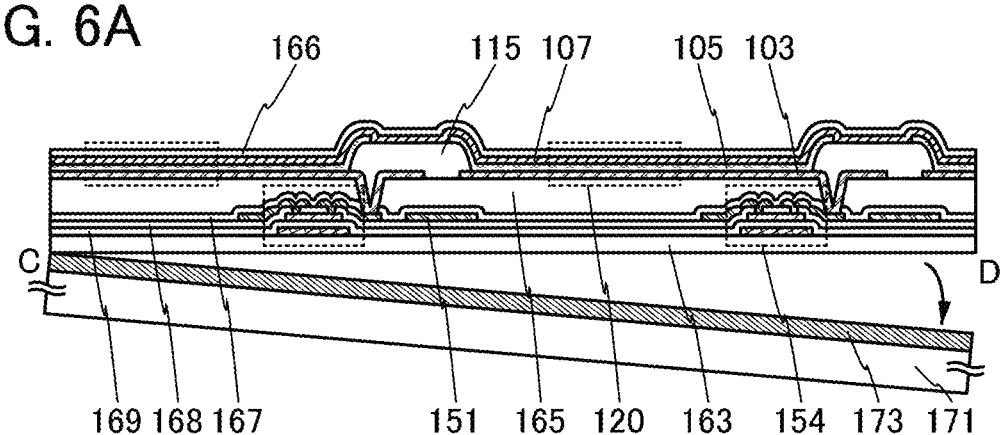
FIGS. 6A to 6C illustrate a method for manufacturing a light-emitting device according to one embodiment of the present invention.

Next, separation is performed between the insulating layer 163 and the separation layer 173 (see FIG. 6A). As a separation method, any of various methods can be employed.

Here, a metal oxide film is formed at the interface between the separation layer 173 and the insulating layer 163 due to heat applied to the separation layer 173 and the insulating layer 163 in the transistor formation process. For example, a groove (not shown) reaching the separation layer 173 is formed to utilize such a phenomenon that the metal oxide film is embrittled because of the groove, so that the separation occurs at the interface between the separation layer 173 and the insulating layer 163.

As a separation method, mechanical force (a separation process with a human hand or with a gripper, a separation process by rotation of a roller, or the like) may be used. In addition, the insulating layer 163 may be separated from the separation layer 173 by dropping a liquid into the groove and flowing the liquid into the interface between the separation layer 173 and the insulating layer 163. Further alternatively, a method may be used in which a fluoride gas such as $NF_3$, $BrF_3$, or $ClF_3$ is introduced into the groove and the separation layer 173 is removed by etching with the use of the fluoride gas so that the insulating layer 163 is separated from the support substrate 171 having an insulating surface.

As another separation method, in the case where the separation layer 173 is formed using tungsten, separation can be performed while the separation layer 173 is etched by a mixed solution of ammonia water and hydrogen peroxide water.

When a film containing nitrogen, oxygen, hydrogen, or the like (e.g., an amorphous silicon film containing hydrogen, an alloy film containing hydrogen, or an alloy film containing oxygen) is used as the separation layer 173 and a substrate having a light-transmitting property is used as the support substrate 171, the following method can be used: the separation layer 173 is irradiated with laser light from the support substrate 171 side, and nitrogen, oxygen, or hydrogen contained in the separation layer is evaporated, so that separation occur between the support substrate 171 and the separation layer 173.

Figure 6B:
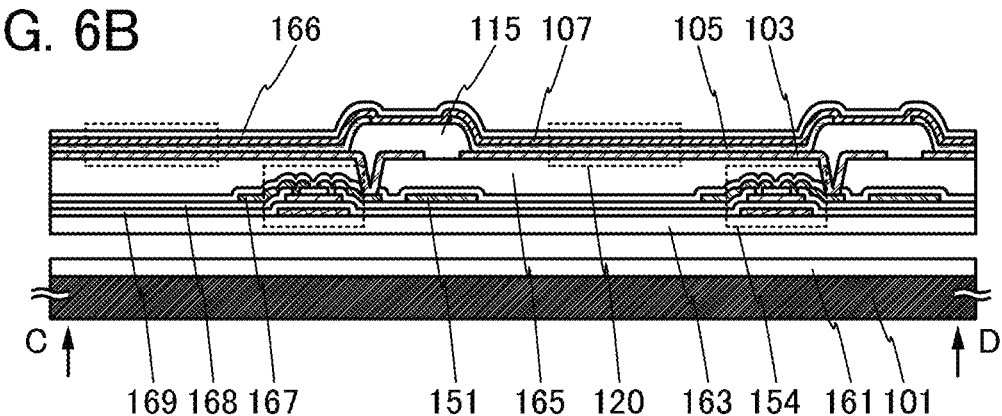

Next, the insulating layer 163 is bonded to the substrate 101 using the bonding layer 161 (see FIG. 6B). This process is also referred to as transfer.

As the bonding layer 161, various curable adhesives, e.g., a photocurable adhesive such as a UV curable adhesive, a reactive curable adhesive, a thermosetting adhesive, and an anaerobic adhesive can be used. As the material of the adhesive, an epoxy resin, an acrylic resin, a silicone resin, a phenol resin, or the like can be used.

Figure 6C:
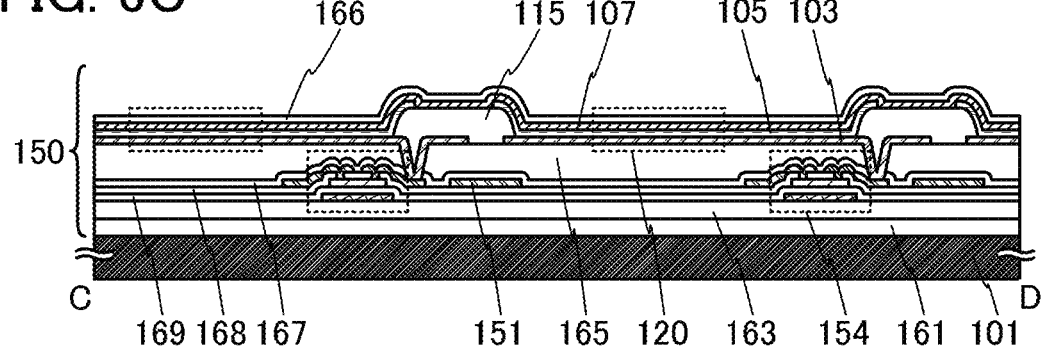

Through the above process, the image display unit 150 can be formed over the substrate 101 having plasticity (see FIG. 6C).

The manufacturing method of a light-emitting device exemplified in Embodiment 1 using such a substrate 101 provided with the image display unit 150 is applied; thus, an image display device having a curved light-emitting surface can be manufactured. In that case, the image display unit 150 is replaced with the light-emitting unit 110 exemplified in Embodiment 1.

Note that this embodiment can be combined with any of the other embodiments and examples described in this specification as appropriate.

(Embodiment 3)

In this embodiment, examples of an electronic device or a lighting device using the light-emitting device of one embodiment of the present invention will be described with reference to drawings.

As examples of the electronic devices to which the light-emitting device having a curved light-emitting surface is applied, the following can be given: television devices (also referred to as televisions or television receivers), monitors of computers or the like, cameras such as digital cameras or digital video cameras, digital photo frames, mobile phones (also referred to as cellular phones or cellular phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 7A:
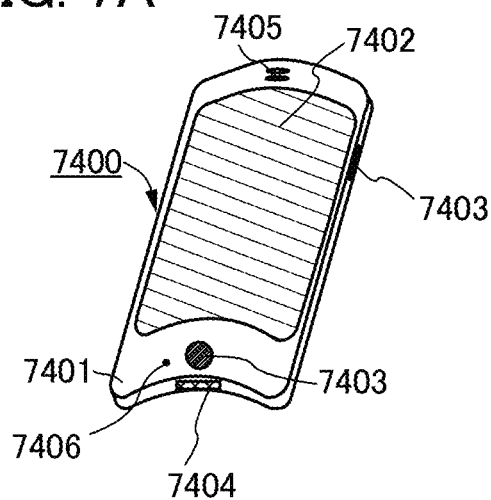
FIGS. 7A to 7E illustrate application examples of a light-emitting device according to one embodiment of the present invention.

FIG. 7A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 7A is touched with a finger or the like, data can be input into the mobile phone 7400. Further, operations such as making a call and inputting a letter can be performed by touch on the display portion 7402 with a finger or the like.

With the operation buttons 7403, power ON or OFF can be switched. In addition, a variety of images displayed on the display portion 7402 can be switched; switching a mail creation screen to a main menu screen, for example.

The display portion 7402 includes a light-emitting device of one embodiment of the present invention; thus, a reliable mobile phone having a curved display portion can be provided.

Figure 7B:
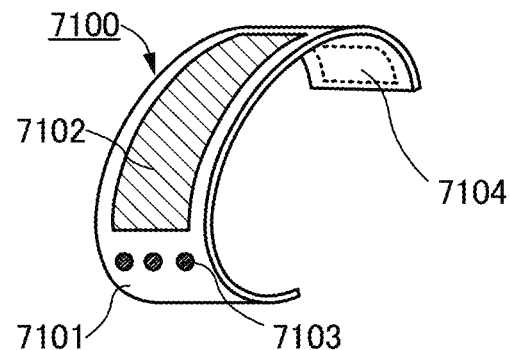

FIG. 7B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

The display portion 7102 includes a light-emitting device of one embodiment of the present invention; thus, a reliable portable display device having a curved display portion can be provided.

Figure 7C:
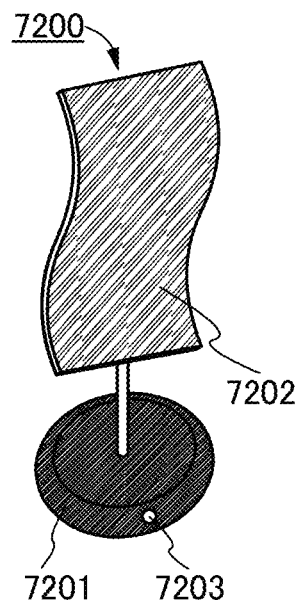
Figure 7D:
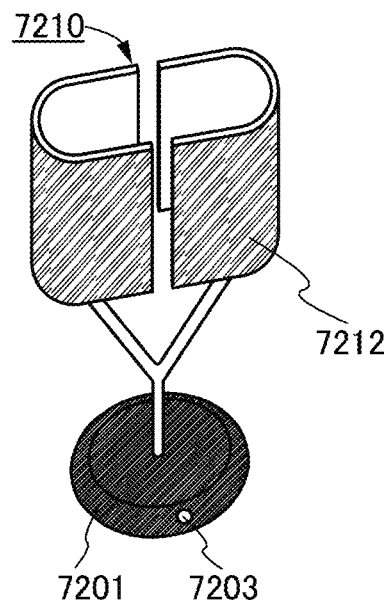
Figure 7E:
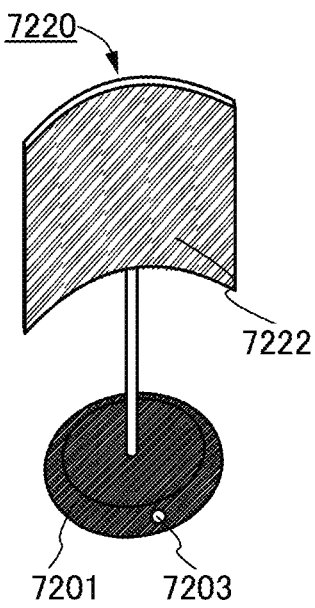

FIGS. 7C to 7E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 7C includes a light-emitting portion 7202 having a wave-shaped light-emitting surface, which is good-design lighting device.

A light-emitting portion 7212 included in the lighting device 7210 illustrated in FIG. 7D has two convex-curved light-emitting portions symmetrically placed. Thus, all directions can be illuminated with the lighting device 7210 as a center.

The lighting device 7220 illustrated in FIG. 7E includes a concave-curved light-emitting portion 7222. This is suitable for illuminating a specific range because light emitted from the light-emitting portion 7222 is collected to the front of the lighting device 7220.

The light-emitting portion 7222 includes a light-emitting device of one embodiment of the present invention; thus, a reliable lighting device having a curved display portion can be provided.

Needless to say, there is no particular limitation to the above-described electronic device or the above-described lighting device as long as the light-emitting device of one embodiment of the present invention is included.

Note that this embodiment can be combined with any of the other embodiments and examples described in this specification as appropriate.

EXAMPLE 1

In this example, light-emitting elements were each formed over each of an insulating substrate and a conductive substrate. Measurement results of temperature characteristics when these light-emitting elements emitted light will be described.

[Manufacturing Sample]

First, a 0.2-mm-thick aluminum substrate and a 0.7-mm-thick glass substrate were prepared.

Then, as a planarization layer, an epoxy resin layer about 6 μm thick was formed over each substrate by a spin-coating method.

Next, as a first electrode and a wiring, a titanium film about 50 nm thick, an aluminum film about 200 nm thick, and a titanium film about 100 nm thick were stacked in this order by a sputtering method using a blocking mask.

Next, as an insulating layer covering an end portion and the like of the first electrode, an epoxy resin layer about 20 μm thick was formed by a screen printing method.

A white-light-emitting EL layer was formed by a vacuum evaporation method so as to overlap with the first electrode. Then, as a second electrode, a silver-magnesium alloy film about 30 nm thick was formed over the EL layer by a vacuum evaporation method.

In this manner, a light-emitting element in which a light-emitting region about 56 mm length and about 42 mm width was formed over each of the aluminum substrate and the glass substrate. Here, a sample using the aluminum substrate is referred to as Sample 1, and a sample using the glass substrate is referred to as Sample 2. In this example, two Samples 1 and two Samples 2 were manufactured.

[Temperature Characteristics Evaluation]

Time dependence of temperature on the light-emitting surfaces when the samples emit light was evaluated.

In the evaluation, the sample was put on a stainless-steel table, a 0.7-mm-thick glass plate was put on the sample, a thermocouple was attached to a top surface of the glass plate, whereby the temperature of the vicinity of the light-emitting surface was measured. The temperature measurement was performed at two points on the light-emitting surface: a center and a region close to an outer edge.

Figure 8A:
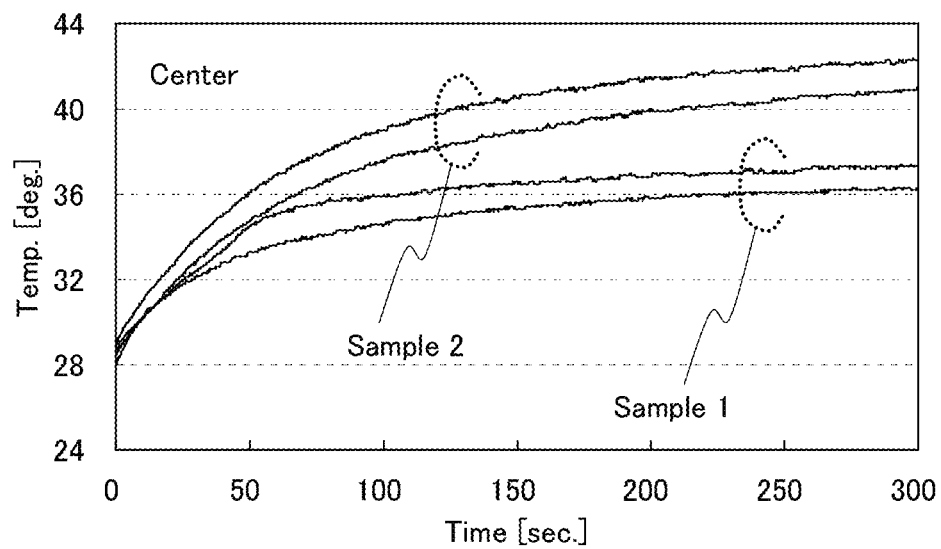
FIGS. 8A and 8B are measurement results of temperature properties according to Example 1.
Figure 8B:
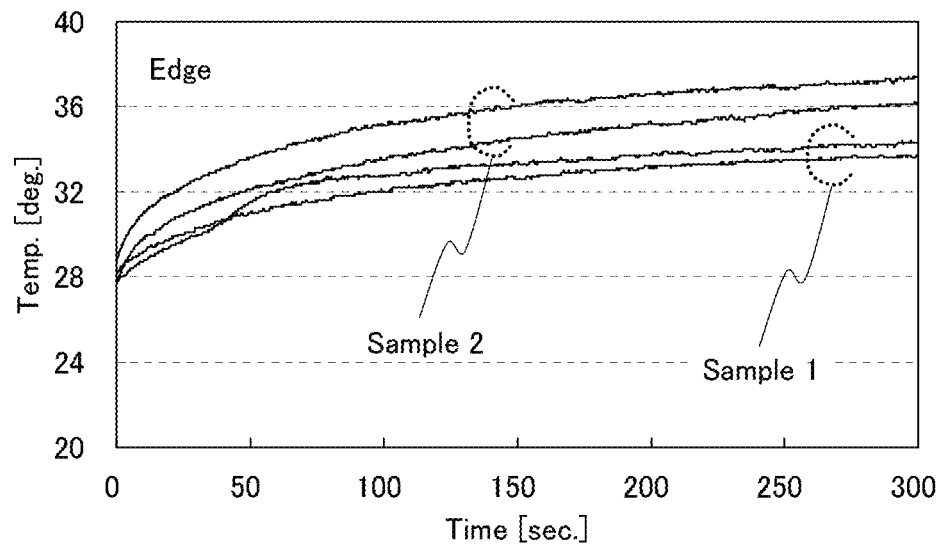

FIGS. 8A and 8B show measurement results of temperature change with respect to time from start of light-emission at the measurement points of each sample. FIG. 8A shows measurement results at the center of the light-emitting surface. FIG. 8B shows measurement at the region close to an outer edge of the light-emitting surface. The measurement results are described below.

In each sample, the heat generating temperatures at the center tended to be higher than those in the region close to an outer edge of the light-emitting surface.

Focusing on the center of Sample 1 using the aluminum substrate, temperatures steeply increased within about 50 seconds of the start of light-emission, after that, temperatures tended to increase gradually. The temperatures in the vicinity of the light-emitting surface were, after 300 seconds of the start of light-emission, about 37° C. in the center and about 34° C. in the region close to an outer edge.

In contrast, in Sample 2 using the glass substrate, temperatures increased more steeply than in Sample 1 after the start of light-emission, and temperatures tended to continue increasing at a rate larger than in Sample 1. The temperatures in the vicinity of the light-emitting surface were, after 300 seconds of the start of light-emission, about 42° C. in the center and about 37° C. in the region close to an outer edge.

From the above results, it was confirmed that higher heat dissipation can be achieved by using a metal substrate as a substrate.

This example can be combined with the other example and any of the embodiments described in this specification as appropriate.

EXAMPLE 2

In this example, a light-emitting device manufactured by the method exemplified in Embodiment 1 will be described.

Firstly, like Sample 1 described in Example 1, a planarization layer, a first electrode layer, an insulating layer, an EL layer, and a second electrode layer were formed over an aluminum substrate; thus, a light-emitting element including a light-emitting region about 56 mm length and about 42 mm width was formed.

Secondly, the aluminum substrate provided with the light-emitting element was curved and fixed to a support having a convex surface at a curvature radius of 45 mm, using a low-viscosity adhesive.

Next, as a sealing material, a photocurable epoxy resin was dropped on the aluminum substrate.

As a protective layer, a stack was used in which a glass layer about 50 μm thick, a bonding layer about 20 μm thick, a resin layer of polyethylene terephthalate (PET) about 38 μm thick were stacked in this order, and an end portion of the protective layer was tightly attached to the photocurable epoxy resin in a region where the light-emitting element was not provided over the aluminum substrate. Then, the attached portion was irradiated with UV rays of 365 nm wavelength from above the protective layer to cure the epoxy resin, whereby the protective layer was tightly attached to part of the aluminum substrate.

Next, while pressing a roller member on a top surface of the protective layer, the roller member was rolled along the curved surface of the support with the attached portion as the starting point, whereby the protective layer was tightly attached to the photocurable resin.

Lastly, an uncured region of the photocurable resin was irradiated with the UV rays from above the protective layer and was cured, whereby the aluminum substrate was completely attached to the protective layer.

In this manner, a light-emitting device having a curved light-emitting portion over an aluminum substrate was manufactured.

Figure 9:
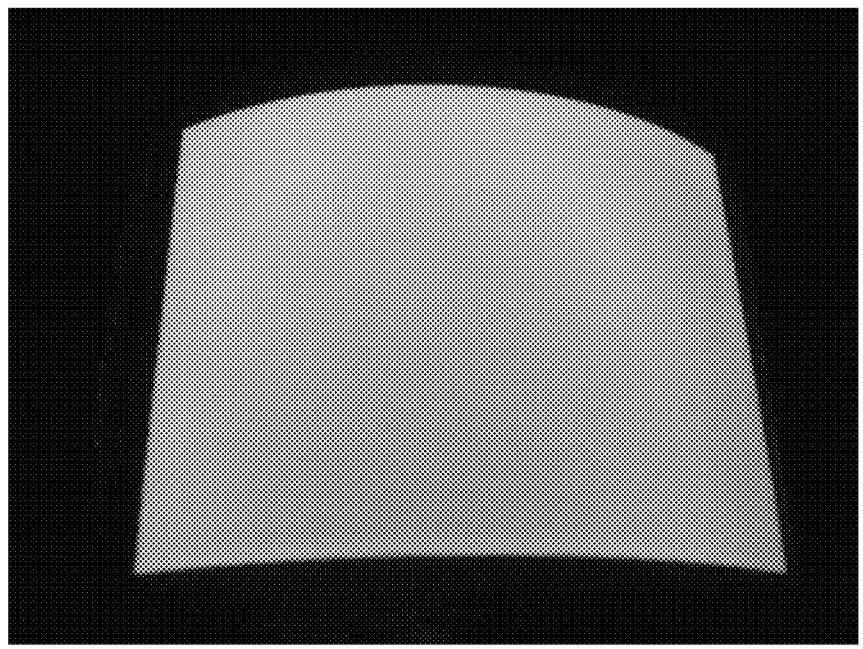
FIG. 9 is an image of a light-emitting device according to Example 2.

FIG. 9 is an image when the manufactured light-emitting device emits light.

It is confirmed that the light-emitting device manufactured in this example favorably emitted light at room temperature under normal humidity even after 380 hours. Note that a defect in light emission was found in a sample without the protective layer about 82 hours after the manufacturing.

From the above results, it was confirmed that with the manufacturing method of one embodiment of the present invention, a light-emitting device having a curved light-emitting surface was able to be manufactured without problems such as a crack or a break. Further, it was confirmed that the light-emitting device manufactured in this manner was highly reliable without defective sealing.

This example can be combined with any of the embodiments and example described in this specification as appropriate.

This application is based on Japanese Patent Application serial No. 2011-282481 filed with Japan Patent Office on Dec. 23, 2011, the entire contents of which are hereby incorporated by reference.

What is claimed is:

1. An electronic device, comprising:
   a sealant having a first curved surface and a second curved surface opposite to the first curved surface, wherein the sealant comprises a curable material;
   a light emitting element conformably disposed adjacent to the first curved surface of the sealant; and
   a protective layer,
   wherein the sealant is located between the protective layer and the light emitting element,
   wherein the protective layer is a stack of a glass layer, a bonding layer, and a resin layer, and
   wherein the thickness of the glass layer is greater than or equal to 20 µm and less than or equal to 200 µm.

2. The electronic device according to claim 1, wherein the light emitting element is disposed over a substrate having plasticity.

3. The electronic device according to claim 1, wherein the curable material is a photocurable material.

4. The electronic device according to claim 1, wherein the first curved surface has a convex shape, a concave shape or a wave-like shape.

5. The electronic device according to claim 1, wherein the electronic device comprises a display device.

6. The electronic device according to claim 1, wherein the light emitting element is disposed over a planarization layer comprising an organic material.

7. An electronic device, comprising:
   a sealant having a first curved surface and a second curved surface opposite to the first curved surface, wherein the sealant comprises a thermosetting organic resin;
   a light emitting element conformably disposed adjacent to the first curved surface of the sealant; and
   a protective layer,
   wherein the sealant is located between the protective layer and the light emitting element,
   wherein the protective layer is a stack of a glass layer, a bonding layer, and a resin layer, and
   wherein the thickness of the glass layer is greater than or equal to 20 µm and less than or equal to 200 µm.

8. The electronic device according to claim 7, wherein the light emitting element is disposed over a substrate having plasticity.

9. The electronic device according to claim 7, wherein the first curved surface has a convex shape, a concave shape or a wave-like shape.

10. The electronic device according to claim 7, wherein the electronic device comprises a display device.

11. The electronic device according to claim 7, wherein the light emitting element is disposed over a planarization layer comprising an organic material.

* * * * *